US006316152B1

(12) United States Patent
Hsieh et al.

(10) Patent No.: US 6,316,152 B1
(45) Date of Patent: Nov. 13, 2001

(54) OPC METHOD TO IMPROVE E-BEAM WRITING TIME

(75) Inventors: Hong-Chang Hsieh, Hsin-chu; Hung-Jui Kuo, Taipei; Shinn-Sheng Yu, Taichung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/483,036

(22) Filed: Jan. 18, 2000

(51) Int. Cl.[7] ................................ G03F 9/00; G03C 5/00

(52) U.S. Cl. ................................................ 430/5; 430/296

(58) Field of Search .......................................... 430/5, 296

(56) References Cited

U.S. PATENT DOCUMENTS 5,682,232 10/1997 Pasch et al. ......................... 364/491
5,847,421 12/1998 Yamaguchi .......................... 257/207
5,900,338 5/1999 Garza et al. ............................. 430/5
6,040,114 * 3/2000 Inoue et al. .......................... 430/296
6,165,652 * 12/2000 Inoue et al. .............................. 430/5

* cited by examiner

*Primary Examiner*—Christopher G. Young
(74) *Attorney, Agent, or Firm*—George O. Saile; Stephen B. Ackerman

(57) ABSTRACT

Jogs are sometimes needed in lines that are used as wires in integrated circuits. In the prior art, these jogs are introduced by inserting a diagonal segment at the desired location. This type of shape is expensive to generate when electron beam writing is used. In the present invention the problem is solved by forming the jog through a simple lateral sliding of two halves of the line relative to one another. The resulting line pattern has both sharp corners and a central constriction but when it is transferred to photoresist, using standard photolithographic techniques, both the sharp corners and the constriction are no longer present, provided no OPC was applied to that section of the line. The motivation for this is the much lower cost of E-beam drawing for the structure of the present invention relative to structures of the prior art.

18 Claims, 1 Drawing Sheet

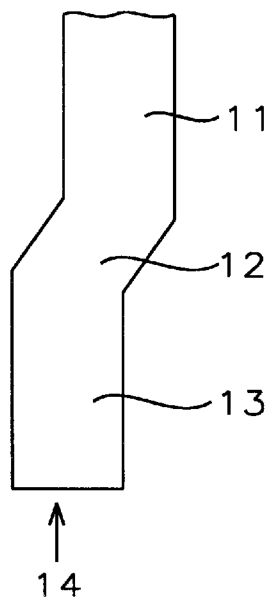
FIG. 1 – Prior Art
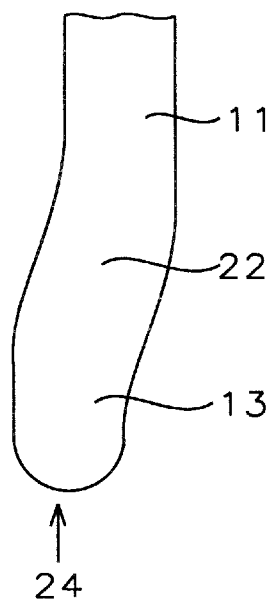
FIG. 2 – Prior Art
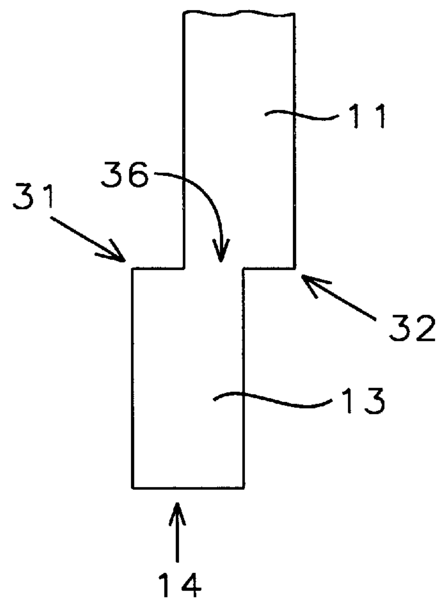
FIG. 3
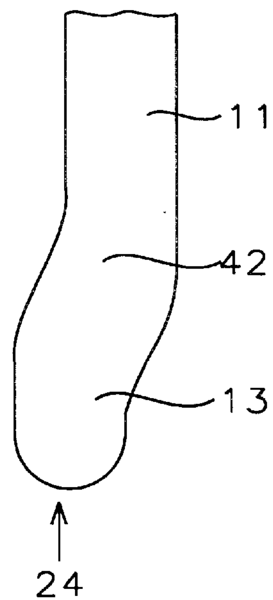
FIG. 4

OPC METHOD TO IMPROVE E-BEAM WRITING TIME

FIELD OF THE INVENTION

The invention relates to the general field of photolithography with particular reference to line layouts that include a jog.

BACKGROUND OF THE INVENTION

In integrated circuits, the wiring that connects the various devices and components that make up the full chip is usually generated through design automation software. In most cases wires are laid down as straight lines that run along one of only two orthogonal directions (X and Y). Occasionally, however, a situation arises in which a wire needs to be laterally moved by a small amount (generally less than a line width) at some point along its path to avoid either overlying, underlying, or touching a particular component or device or even another wire.

The standard way of introducing such a jog into the path of a wire is illustrated in FIG. 1. Upper segment 11 and lower segment 13 are seen to be joined by diagonal segment 12. Although it would be easier to simply cut the original line at a suitable location and then but the two ends together again, after sliding either end laterally relative to the other, this would result in sharp corners (such as 31 and 32 in FIG. 3) being formed.

It is generally agreed that a structure such as the one illustrated schematically in FIG. 3 represents an undesirable way to introduce a jog into a wire. This is because sharp corners are potential high field spots at which current leakage could occur and because significant narrowing of the wire has been introduced at the jog. Objections to this way of forming a jog were valid at a time when patterns on reticles were transferred to photoresist without distortion. For this reason the diagonal design shown in FIG. 1 was widely adopted.

Originally, patterns for use in reticles were formed using special plastic sheeting (known as rubyliths) which were cut up on X-Y plotters to form the required pattern, which was then photo-reduced onto the reticle. For this technology cutting lines in a diagonal direction (as in segment 12 of FIG. 1) presented no difficulties. However, as line dimensions have grown ever smaller so that the limits of optical imaging have been approached, reticle patterns must be formed using electron beam writing. This is accomplished using a raster in a manner similar to scanning a picture onto a television screen. As is well known, sharp diagonals are notoriously difficult to display on a television screen, being always limited by the pixel size of the system. In a similar way, writing a diagonal line using standard (i.e. raster) electron beam writing requires the production of many small squares, as opposed to the ease of being able to draw objects whose edges run only in the X or Y directions. Thus, drawing diagonal lines using electron beams is very expensive. Despite this, it remains standard in the art to form jogs in the manner depicted in FIG. 1.

Another side effect of photolithography that operates close to the optical limit is the appearance of optical proximity effects (OPE). Because of interference between the edge diffraction patterns that are present in any optical image, severe distortions of the image can occur when it is transferred from reticle to resist. An example of this is seen in FIG. 2 which shows the photoresist pattern that resulted when the jogged line of FIG. 1 was imaged onto photoresist using light whose wavelength was comparable to the width of the line. Segment 11 remains relatively free of distortion (its end is outside the figure) but the end of segment 13 is seen to have been rounded as can be seen by comparing end 14 in FIG. 1 with end 24 of FIG. 2. Also significant is the fact that the relatively blunt corners associated with diagonal segment 12 in FIG. 1 have been further smoothed making for a more gentle transition from segment 11 to segment 13.

Since the line shape seen in FIG. 2 is an improvement over the de facto standard diagonal shape of FIG. 1, the prior art has tended to "leave good enough alone" and has continued to form jogged lines by using a shape of the type shown in FIG. 1 in the reticle. As we will show below, it is possible to use a shape that is much cheaper to produce by electron beam writing while still ending up with an image at the photoresist that is very similar to that shown in FIG. 2.

A routine search of the prior art was performed but no references that describe the exact structure and method of the present invention were found. Several references of interest were, however, encountered. For example, in U.S. Pat. No. 5,682,323, Pasch et al. show an OPC (optical proximity correction) system for mask design. Yamaguchi in U.S. Pat. No. 5,847,421 shows a logic-cell having an efficient OPC correction where poly width are corrected, while Garza et al. In U.S. Pat. No. 5,900,338 show an OPC method based on using design rule checkers.

SUMMARY OF THE INVENTION

It has been an object of the present invention to provide a design for a jogged line which, when transferred to photoresist, has no constrictions or sharp corners.

Another object of the invention has been to provide a method for implementing and using said design.

A further object of the invention has been that said method be effective at a wavelength range where optical proximity effects are present.

These objects have been achieved by forming the jog through a simple lateral sliding of two halves of the line relative to one another. The resulting line pattern has both sharp corners and a central constriction but when it is transferred to photoresist, using standard photolithographic techniques, both the sharp corners and the constriction are no longer present, provided no OPC was applied to that section of the line. The motivation for this is the much lower cost of E-beam drawing for the structure of the present invention relative to structures of the prior art.

BRIEF DESCRIPTION OF THE DRAWINGS

FIG. 1 shows a line pattern that includes a jog designed according to principles of the prior art.

FIG. 2 shows the appearance of the jogged line of FIG. 1 after transfer into photoresist.

FIG. 3 shows a line pattern that includes a jog designed according to principles of the present invention.

FIG. 4 shows the appearance of the jogged line of FIG. 3 after transfer into photoresist.

DESCRIPTION OF THE PREFERRED EMBODIMENTS

We will disclose the present invention through a description of the method used to manufacture it. This will also make clear the structure of the present invention.

As discussed earlier, the simplest way to introduce a jog into a line pattern is to cut it in half and then slide the two halves relative to one another thereby forming the structure illustrated in FIG. 3. The direction that the upper segment 11 slides relative to lower segment 13 may be either to the left or the right, depending on the needs of the wiring program. The degree of sliding (the amount of lateral displacement) would be between about 0.03 and 0.05 microns or between about 0.15 and 0.25 times the width of the line. There are, also as previously discussed, good reasons for not using a structure of this type—if it is precisely reproduced in the photoresist pattern. However, because of optical proximity effects, when the wavelength of the imaging radiation is approximately the same, or greater, than the width of the lines, the structure of FIG. 3 has the appearance shown in FIG. 4 when transferred to a layer of photoresist.

Thus the method of the present invention is to use an electron beam writing system to draw a line pattern of the form shown in FIG. 3 as part of a more general wiring pattern on a reticle that will be used in a projection system for photolithography. Using the geometry of FIG. 3 implies that the cost of drawing the jog is low. The width of the line (segments 11 and 13) is between about 0.20 and 0.22 microns.

With the reticle in place in the projection system, the layer of photoresist (which may be either a positive or a negative resist) is exposed through the projection system to suitable actinic radiation for between about 0.055 and 0.060 seconds. Said radiation would have a wavelength that is between about 1.1 and 1.15 times the line width (e.g. the width of segment 11), corresponding to an actual wavelength between about 193 and 248 nm. depending on which technology is being used.

As noted earlier, because of optical proximity effects the pointed corners 31 and 32 seen in FIG. 3 have been smoothed out and are essentially absent from FIG. 4 (notably segment 42). Additionally, the constriction 36 of FIG. 3 is no longer present in FIG. 4, removing the danger of a hot spot appearing at the jog.

It is important to observe here that normally Optical Proximity Correction (OPC) methods would be routinely applied to the entire line pattern prior to transferring it to the reticle. OPC serves to compensate for OPE so that the pattern that is transferred to the photoresist is essentially undistorted. As part of the present invention no optical proximity corrections may be applied to the pattern in the vicinity of the jog (typically over a length that extends between about 50 and 80 microns on either side of the jog).

While the invention has been particularly shown and described with reference to the preferred embodiments thereof, it will be understood by those skilled in the art that various changes in form and details may be made without departing from the spirit and scope of the invention.

What is claimed is:

1. A line layout within a pattern on a reticle for use during photolithography, comprising:

a first line segment, having a width and a lower end having pointed corners;

a second line segment having said width and an upper end having pointed corners;

the second segment being laterally displaced, by an amount less than said width, relative to the first segment; and said upper and lower ends touching, whereby said segments are part of a single continuous line in which there is a jog.

2. The line layout described in claim 1 wherein the pattern on the reticle has been formed using an electron beam.

3. The line layout described in claim 1 wherein no optical proximity correction has been applied to the pattern at the jog.

4. The line layout described in claim 1 wherein said width is between about 0.2 and 0.22 microns.

5. The line layout described in claim 1 wherein the amount of lateral displacement is between about 0.03 and 0.05 microns.

6. The line layout described in claim 1 wherein the second segment is laterally displaced to the left of the first segment.

7. The line layout described in claim 1 wherein the second segment is laterally displaced to the right of the first segment.

8. A method for forming a photoresist pattern, comprising:

providing a layer of photoresist;

providing a reticle that includes a first line segment, having a width and a lower end having pointed corners, a second line segment having said width and an upper end having pointed corners, the second segment being laterally displaced, by an amount less than said width, relative to the first segment and said upper and lower ends touching, whereby said segments are part of a single continuous line in which there is a jog; and exposing the photoresist to actinic radiation, having a wavelength that is between about 1.10 and 1.15 times said width, whereby, because of optical proximity effects at said wavelength, an image of the line is formed in which all pointed corners at the jog have been smoothed out.

9. The method of claim 8 wherein the pattern on the reticle has been formed using an electron beam.

10. The method of claim 8 wherein no optical proximity correction has been applied to the pattern at the jog.

11. The method of claim 8 wherein said width is between about 0.20 and 0.22 microns.

12. The method of claim 8 wherein the amount of lateral displacement is between about 0.03 and 0.05 microns.

13. The method of claim 8 wherein the second segment is laterally displaced to the left of the first segment.

14. The method of claim 8 wherein the second segment is laterally displaced to the right of the first segment.

15. The method of claim 8 wherein said wavelength is between about 193 and 248 nm.

16. The method of claim 8 wherein the photoresist is exposed for between about 0.055 and 0.60 seconds.

17. The method of claim 8 wherein the photoresist is a negative resist.

18. The method of claim 8 wherein the photoresist is a positive resist.

* * * * *